(12) United States Patent
Finch

(10) Patent No.: US 12,079,593 B2
(45) Date of Patent: Sep. 3, 2024

(54) POWER SAVING FLOATING POINT MULTIPLIER-ACCUMULATOR WITH A HIGH PRECISION ACCUMULATION DETECTION MODE

(71) Applicant: Redpine Signals, Inc., San Jose, CA (US)

(72) Inventor: Dylan Finch, San Jose, CA (US)

(73) Assignee: Ceremorphic, Inc., San Jose, CA (US)

( * ) Notice: Subject to any disclaimer, the term of this patent is extended or adjusted under 35 U.S.C. 154(b) by 177 days.

(21) Appl. No.: 17/352,373

(22) Filed: Jun. 21, 2021

(65) Prior Publication Data

US 2022/0405053 A1    Dec. 22, 2022

(51) Int. Cl.
| | |
|---|---|
| G06F 7/544 | (2006.01) |
| G06F 5/01 | (2006.01) |
| G06F 7/485 | (2006.01) |
| G06F 7/487 | (2006.01) |

(52) U.S. Cl.
CPC ............ *G06F 7/5443* (2013.01); *G06F 5/012* (2013.01); *G06F 7/485* (2013.01); *G06F 7/4876* (2013.01)

(58) Field of Classification Search
CPC ........ G06F 7/5443; G06F 17/16; G06F 7/485; G06F 7/4876; G06F 7/38–575
See application file for complete search history.

(56) References Cited

U.S. PATENT DOCUMENTS

| | | | |
|---|---|---|---|
| 8,626,813 B1* | 1/2014 | Swartzlander | G06F 7/5443 708/501 |
| 10,481,869 B1* | 11/2019 | Wang | G06F 7/487 |
| 2014/0067895 A1 | 3/2014 | Wang | |
| 2019/0042252 A1* | 2/2019 | Kaul | G06F 9/30036 |
| 2020/0133633 A1 | 4/2020 | Yoshinaga et al. | |
| 2020/0183650 A1 | 6/2020 | Mudawar | |
| 2020/0272417 A1* | 8/2020 | Feng | G06N 3/063 |
| 2020/0409659 A1 | 12/2020 | Brunie | |
| 2021/0073171 A1* | 3/2021 | Master | G06F 7/523 |
| 2021/0182026 A1 | 6/2021 | Carlson | |

* cited by examiner

*Primary Examiner* — Jyoti Mehta
*Assistant Examiner* — Vivian Diem Ha Ledynh
(74) *Attorney, Agent, or Firm* — File-EE-Patents.com; Jay A. Chesavage

(57) ABSTRACT

A floating point multiplier-accumulator (MAC) multiplies and accumulates N pairs of floating point values using N MAC processors operating simultaneously, each pair of values comprising an input value and a coefficient value to be multiplied and accumulated. The pairs of floating point values are simultaneously processed by the plurality of MAC processors, each of which output a signed integer form fraction with a first bitwidth and a second bitwidth, along with a maximum exponent. The first bitwidth signed integer form fractions are summed by an adder tree using the first bitwidth to form a first sum, and when an excess leading 0 condition is detected, a second adder tree operative on the second bitwidth integer form fractions forms a second sum. The first sum or second sum, along with the maximum exponent, is converted into floating point result.

20 Claims, 10 Drawing Sheets

Sign Processor

Mantissa Processor

Exponent Processor

Pad, Complement, Shift (PCS) Processor

Adder Tree Element w/Selectable bitwidth

Unit Element MAC Process

Adjust EXP_DIFF, MAX_EXP

Unit Element MAC Process

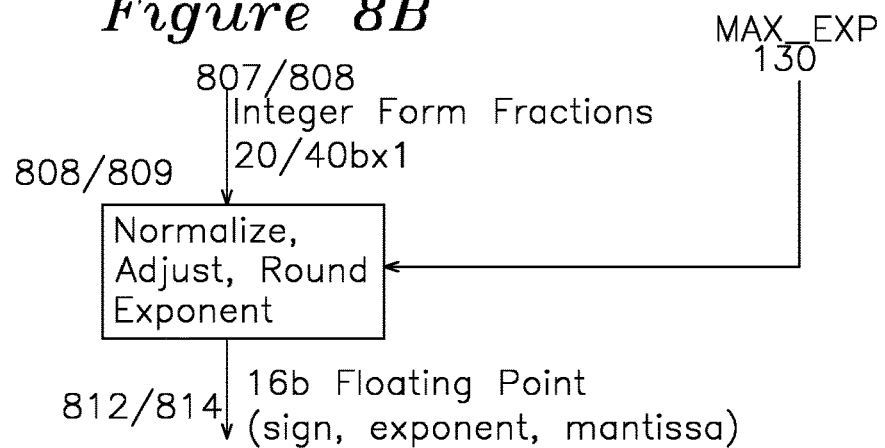
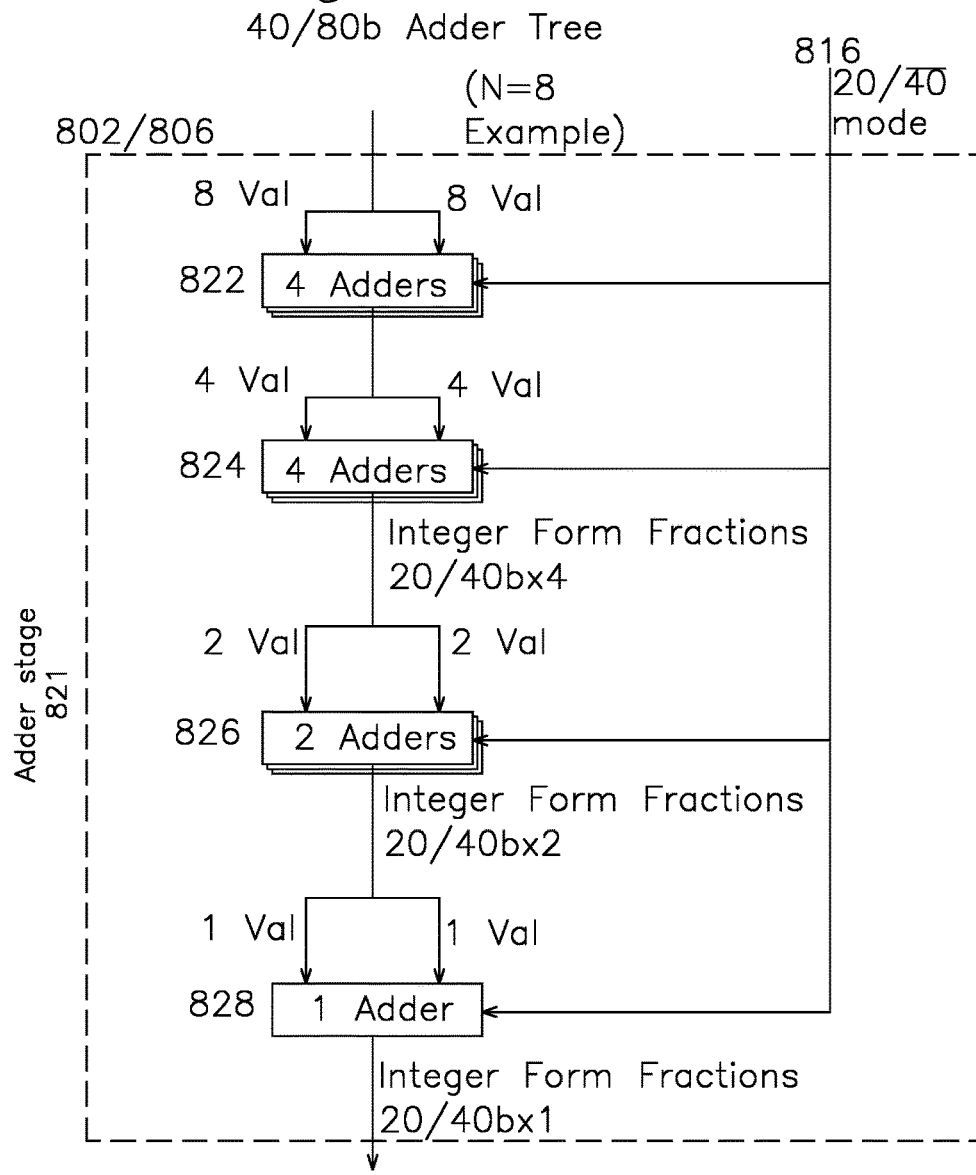

POWER SAVING FLOATING POINT MULTIPLIER-ACCUMULATOR WITH A HIGH PRECISION ACCUMULATION DETECTION MODE

FIELD OF THE INVENTION

The present invention relates to a Multiplier-Accumulator for performing dot product computations between an input multiplicand matrix and a coefficient multiplicand matrix, forming a result from the sum of products.

BACKGROUND OF THE INVENTION

In machine learning applications, it is often desired to form dot product multiplications between a 1×n input row vector A and a n×m B coefficient matrix to generate a m×1 result R, such as:

$$[a_1 \ a_2 \ \ldots \ a_n] \cdot \begin{bmatrix} b_{11} & \ldots & b_{1m} \\ \vdots & \ddots & \vdots \\ b_{n1} & \ldots & b_{nm} \end{bmatrix} = R = \begin{bmatrix} a_1 b_{11} + a_2 b_{21} + \ldots + a_n b_{n1} \\ a_1 b_{12} + a b_{22} + \ldots + a_n b_{n2} \\ \vdots \\ a_1 b_{1m} + a_2 b_{2m} + \ldots + a_n b_{nm} \end{bmatrix}^T$$

One problem of prior art integer architectures is that the number of multiplication and addition operations scales as the product of n and m. For signed floating point multiplication operations, the complexity becomes much greater. Additionally, for cases where the multiplicands are of sufficiently different order, the accumulator precision remains fixed, regardless of the contribution to the accumulated result.

It is desired to provide a scalable high speed, low power multiply-accumulate (MAC) apparatus and method operative to form dot products from the addition of large numbers of floating point multiplicands, and to provide power savings where full precision on intermediate results for accumulation is not required.

OBJECTS OF THE INVENTION

A first object of the invention is a pipelined floating point multiplier having a sign processor, an exponent processor and a mantissa processor for performing multiply-accumulate operations on a linear array of N input floating point numbers with a linear array of N coefficient floating point numbers, each input floating point number and coefficient floating point number comprising a sign bit, an exponent comprising a plurality of exponent bits, and a mantissa comprising a plurality of exponent bits, the floating point multiplier comprising:
  a plurality of pipeline stages, each pipeline stage comprising a first pipeline stage and a second pipeline stage;
  each first pipeline stage comprising:
    an exponent processor forming an exponent sum from an input exponent and coefficient exponent, a maximum exponent finder identifying a maximum exponent sum (MAX_EXP) over all N exponent processors, each pipeline stage computing an exponent difference (EXP_DIFF) of MAX_EXP less a current exponent sum, the exponent processor also providing an adder_en output and a reg_en output for establishing a precision based on exponent difference;
    a sign processor computing a sign bit by exclusive ORing (XOR) an input floating point sign and a coefficient floating point sign;
    a mantissa processor forming a normalized mantissa by an integer multiplication of an input floating point mantissa with a coefficient floating point mantissa;
  each second pipeline stage coupled to a corresponding first pipeline stage, the second pipeline stage receiving a normalized mantissa from the corresponding first pipeline stage, the corresponding second pipeline stage having a mantissa Pad, Complement and Shift (PCS) stage which pads the normalized mantissa by prepending and appending 0s to the normalized mantissa, then performs a 2's complement operation on the padded mantissa when an accompanying sign bit from the first pipeline stage is asserted, and next shifts the padded or padded and 2's complemented mantissa according to an adjusted exponent difference (EXP_DIFF) to form an integer form fraction;
  the plurality of second stage integer form fractions summed to form a single mantissa value, each adder using the adder_en signal to determine an adder precision, the single mantissa value combined with the MAX_EXP value and normalized to form a floating point output value.

A second object of the invention is a process for a unit element multiplier-accumulator (UE MAC) forming a floating point sum of products from a plurality N of floating point input values multiplied by a corresponding floating point coefficient, each floating point value and each coefficient value having a sign bit, a plurality of exponent bits, and a plurality of mantissa bits, the process comprising:
  forming a plurality of N sums of input value exponents and corresponding coefficient exponent and selecting MAX_EXP as the largest sum from the plurality of N sums;
  for each of the N input values and coefficient values:
    separating a sign, mantissa, and exponent value;
    forming a sign bit by exclusive ORing (XOR) an input value sign and a coefficient value sign;
    forming a mantissa multiplication product by multiplying an input mantissa with hidden bit restored with a coefficient mantissa with hidden bit restored, and enabling a number of mantissa multiplication product bits according to an exponent difference;
    normalizing the mantissa multiplication by setting EXP_INC if the integer multiplication generates an overflow, and rounding to an integer value with a reduced number of bits than a number of bits resulting from the integer multiplication;
    computing an exponent_sum_value from an input exponent added to a coefficient exponent;
    computing an exponent difference (EXP_DIFF) by subtracting the exponent sum value from MAX_EXP;
    a processing stage with EXP_DIFF=0 incrementing MAX_EXP if EXP_DIFF is 0 and EXP_INC is set and sending a signal MAX_INC to other stages;
    a processing stage which has EXP_DIFF greater than 0 incrementing EXP_DIFF if EXP_INC is not set and MAX_INC is set;
    a processing stage which has EXP_DIFF greater than 0 decrementing EXP_DIFF if EXP_INC is set and MAX_INC is not set;
    padding the normalized mantissa multiplication with leading 0 s and trailing 0 s;

replacing the padded normalized mantissa multiplication with a twos complement of the padded normalized mantissa multiplication if the sign bit is 1;

generating an output by shifting the padded normalized mantissa multiplication to the right by EXP_DIFF bits;

summing the outputs to form an integer form fraction with a precision determined by an exponent difference;

generating a floating point result by normalizing the integer form fraction by extracting a floating point sign result from the integer form fraction, forming a floating point mantissa result by rounding the integer form fraction, and forming the floating point exponent result from MAX_EXP and leading 0s of the integer form fraction.

A third object of the invention is a precision-aware multiplier accumulator comprising:

a sign processor, an exponent processor and a mantissa processor for performing multiply-accumulate operations on a linear array of N input floating point numbers with a linear array of N coefficient floating point numbers, each input floating point number and coefficient floating point number comprising a sign bit, an exponent comprising a plurality of exponent bits, and a mantissa comprising a plurality of exponent bits, the floating point multiplier comprising:

a plurality of MAC processors, each MAC processor comprising:

an exponent processor forming an exponent sum from an input exponent and coefficient exponent, a maximum exponent finder identifying a maximum exponent sum (MAX_EXP) over all N exponent processors, each MAC processor computing an exponent difference (EXP_DIFF) of MAX_EXP less a current exponent sum, the exponent processor also providing an adder_en output and a reg_en output for establishing a precision based on exponent difference;

a sign processor computing a sign bit by exclusive ORing (XOR) an input floating point sign and a coefficient floating point sign;

a mantissa processor forming a normalized mantissa by an integer multiplication of an input floating point mantissa with a coefficient floating point mantissa;

a mantissa Pad, Complement and Shift (PCS) stage coupled to the normalized mantissa and padding the normalized mantissa by prepending and appending 0s to the normalized mantissa, then performs a 2's complement operation on the padded mantissa when an accompanying sign bit from the first pipeline stage is asserted, and next shifts the padded or padded and 2's complemented mantissa according to an adjusted exponent difference (EXP_DIFF) to form an integer form fraction, the PCS stage configured to generate a first bitwidth output and a second bitwidth output greater than the first bitwidth output;

a pipeline stage coupled to the second bitwidth output of each of the N MAC processors;

a low precision adder tree having a first bitwidth coupled to the first bitwidth output of each of the N MAC processors, the adder tree summing the first bitwidth outputs to form a single mantissa value;

a leading zero detector configured to examine a threshold fraction of leading 0s to the first bitwidth to enable a high precision adder tree coupled to the pipeline stage to form a single mantissa value if the threshold fraction is exceeded;

a floating point normalizer coupled to the low precision adder tree and the high precision adder tree and also the MAX_EXP signal and generating a floating point value.

A fourth object of the invention is a process for a unit element multiplier-accumulator (UE MAC) forming a floating point sum of products from a plurality N of floating point input values multiplied by a corresponding floating point coefficient, each floating point value and each coefficient value having a sign bit, a plurality of exponent bits, and a plurality of mantissa bits, the process comprising:

forming a plurality of N sums of input value exponents and corresponding coefficient exponent and selecting MAX_EXP as the largest sum from the plurality of N sums;

for each of the N input values and coefficient values:
  separating a sign, mantissa, and exponent value;
  forming a sign bit by exclusive ORing (XOR) an input value sign and a coefficient value sign;
  forming a mantissa multiplication product by multiplying an input mantissa with hidden bit restored with a coefficient mantissa with hidden bit restored, and enabling a number of mantissa multiplication product bits according to an exponent difference;
  normalizing the mantissa multiplication by setting EXP_INC if the integer multiplication generates an overflow, and rounding to an integer value with a reduced number of bits than a number of bits resulting from the integer multiplication;
  computing an exponent_sum value from an input exponent added to a coefficient exponent;
  computing an exponent difference (EXP_DIFF) by subtracting the exponent sum value from MAX_EXP;
  a processing stage with EXP_DIFF=0 incrementing MAX_EXP if EXP_DIFF is 0 and EXP_INC is set and sending a signal MAX_INC to other stages;
  a processing stage which has EXP_DIFF greater than 0 incrementing EXP_DIFF if EXP_INC is not set and MAX_INC is set;
  a processing stage which has EXP_DIFF greater than 0 decrementing EXP_DIFF if EXP_INC is set and MAX_INC is not set;
  padding the normalized mantissa multiplication with leading 0s and trailing 0s;
  replacing the padded normalized mantissa multiplication with a twos complement of the padded normalized mantissa multiplication if the sign bit is 1;
  generating an output by shifting the padded normalized mantissa multiplication to the right by EXP_DIFF bits, the output having a first output with a first bitwidth and a second output with a second bitwidth greater than the first bitwidth;

summing the first outputs to form a first integer form fraction, and if a number of leading 0s is greater than a threshold fraction of leading 0s to the first bitwidth, summing the second outputs to form a second integer form fraction;

generating a floating point result by normalizing the first integer form fraction or the second integer form fraction by extracting a floating point sign result from the integer form fraction, forming a floating point mantissa result by rounding the integer form fraction, and forming the floating point exponent result from MAX_EXP and leading 0s of the integer form fraction.

SUMMARY OF THE INVENTION

A unit element multiplier-accumulator for multiplying an input 1×n vector with an n×m coefficient matrix receives the 1×n input vector and n×1 column vector selected from the b coefficient matrix. Corresponding floating point elements of the 1×n vector and n×1 coefficient matrix are applied to n first stages, the first stage separating the sign bit, mantissa, and exponent for a corresponding input floating point component and coefficient floating point component. For example, if there are N=16 input/coefficient products, the architecture provides N=16 first stages, each concurrently performing first stage operations on 16 pairs of input and coefficient floating point values and passing 16 results from a first stage to a corresponding second stage. Each first stage includes a sign bit processor which performs an exclusive OR (XOR) operation on the pair of sign bits to determine a sign, an exponent processor which sums corresponding input and coefficient exponents. A central maximum exponent finder examines all exponent sums to determine a maximum exponent (MAX_EXP) as well as a difference from MAX_EXP for the corresponding exponent sum. Each exponent processor returns an exponent difference (exp_diff) equal to the difference between the maximum exponent and the current exponent. The UE MAC also has a mantissa processor which performs a multiplication and normalization of the mantissa parts and outputs a number of bits of precision according to the exponent difference, the mantissa processor also generating an exponent increment (EXP_INC) output indicating a mantissa overflow. Each first stage thereby produces a sign bit, normalized multiplication result, exponent increment (EXP_INC) result from the mantissa multiplication, and from the plurality of first stages, a maximum exponent (MAX_EXP) value is found, and each first stage thereby computes a difference value (EXP_DIFF) from that stage's exponent sum to the MAX_EXP, which is passed to the corresponding second stage as a difference value EXP_DIFF.

The second pipeline stage thereby receives from each corresponding first pipeline stage the sign bit, the normalized multiplication result, EXP_INC value from the mantissa multiplication indicating a mantissa overflow, the MAX_EXP value, and exponent difference EXP_DIFF. The exponent processor includes an adjustment stage which detects EXP_DIFF=0 (indicating a largest exponent sum) and EXP_INC set, causing MAX_EXP to increment by one and propagate the new value of MAX_EXP to the other stages. Other exponent processors which have EXP_DIFF>0 (second pipeline stages which do not have the largest exponent sum) and EXP_INC not set with MAX_INC set then increment EXP_DIFF, whereas an exponent processor with EXP_INC set and MAX_INC not set decrement EXP_DIFF. An exponent processor with EXP_INC set and MAX_INC also set do not change EXP_DIFF, and adjustment stages with EXP_INC not set and MAX_INC set do not change EXP_DIFF. Each second pipeline stage takes the normalized mantissa multiplication result and modifies it in three steps, referred to as normalized mantissa Pad, Complement, Shift (Mantissa PCS). In a first Pad step, the normalized mantissa multiplication result from 208 is padded by pre-pended the normalized mantissa multiplication result with 0s to accommodate the maximum value that may result from addition of N normalized values, and also appended with 0s for a desired precision by the addition of N stages. Next, if the sign input to the second pipeline stage is negative, the two's complement of the resulting value is substituted, otherwise the resulting value is unchanged. Lastly, the value is shifted to the right by the number bits of the exponent difference (EXP_DIFF) from the first stage, accommodating any exponent adjustments as may be necessary. Each of the N pipeline stages generating an integer form fraction at the output of the Pad, Complement and Shift (PCS) stage, with a bit precision determined by a per-stage Register enable (Reg_en) which zeros or disables least significant bits of the PCS stage output according to a local exponent difference (Exp_diff), such that larger values of Exp_diff result in fewer significant (non-zero) bits of the PCS output.

Each of the N exponent processors examines the exponent difference (exp_diff) value and sign bit and estimates a possible range of output values, each stage indicating an estimated minimum possible value and a maximum possible value (based exclusively on the sign bit and exponent difference). A central range estimator sums all of the minimum possible values to form a minimum value and also sums all of the maximum possible values to form a maximum value. When the maximum and minimum span zero, the adders operate in a full precision mode, otherwise, the maximum and minimum values are compared to determine an associated adder precision of 16 bits, 24 bits, or 32 bits. The PCS processor outputs of the N stages are summed in pairs using the precision specified by the central range estimator until a single integer value representing the sum of all integer form fractions remains. The summed integer form fraction is a signed value which is converted to an unsigned integer value (such as by 2's complement) with the sign extracted and used for the floating point result sign bit, and the summed integer form fraction is normalized to become the mantissa component, and MAX_EXP value is then used provide the exponent component, thereby forming a floating point result with sign bit, exponent, and mantissa that represents the sum of N products formed by each input and coefficient value.

In a second mode of the invention, the output of the PCS stage generates a first low precision integer form fraction with a first bitwidth and also a second high precision integer form fraction with a second bitwidth greater than the first bitwidth. The first low precision integer form fractions are summed and the leading 0s are examined to determine whether the number of leading 0s exceeds a threshold such as more than half of the first bitwidth. If the threshold is not exceeded, the sum is normalized with MAX_EXP to form the floating point result, as previously described. If the threshold is exceeded, then the second high precision integer form fractions are summed and normalized with MAX_EXP to form the floating point result.

BRIEF DESCRIPTION OF THE DRAWINGS

FIGS. 8A, 8B, and 8C show a block diagram for a pipelined floating point multiplier according to a second example of the invention.

DETAILED DESCRIPTION OF THE INVENTION

Figure 1A:
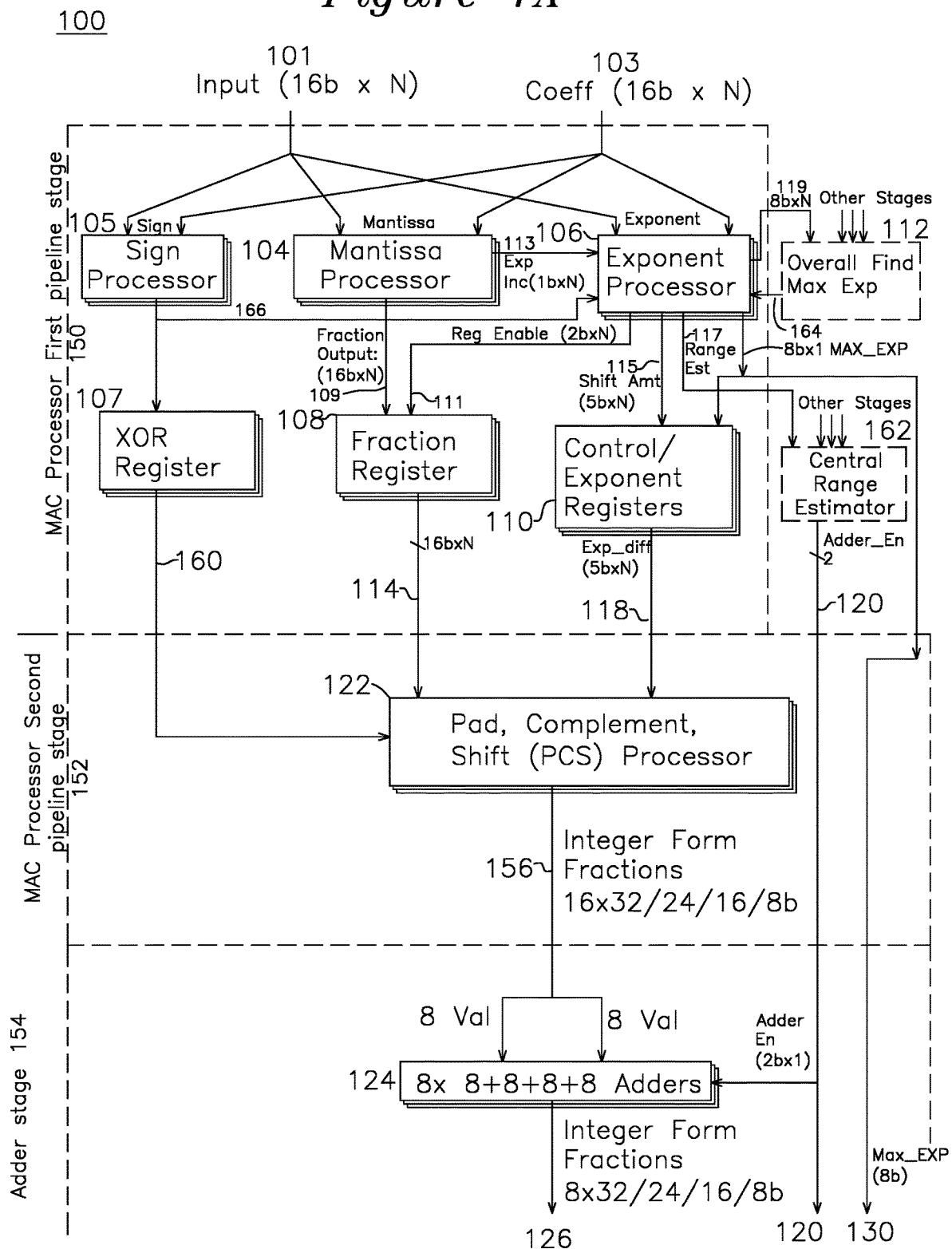
FIGS. 1A and 1B show a block diagram for a pipelined floating point multiplier according to a first example of the invention.

FIG. 1A shows a block diagram for a first example Unit Element (UE) 100 of the present invention. The previously described dot product multiplication-accumulation is performed on individual columns of the B coefficient matrix, each multiplier-accumulator (MAC) multiplying and accumulating the A row (input) matrix by one of the B column (coefficient) matrices known and is known as a "unit element" (UE) performing a MAC function which generates a single sum of input/coefficient products in floating point format. In the present example the complete MAC comprises m such unit elements, each of the m unit elements operating on a unique coefficient column k of the m coefficient columns as:

$$[a_1 \ a_2 \ \ldots \ a_n] \cdot \begin{bmatrix} b_{1k} \\ \vdots \\ b_{nk} \end{bmatrix} = [a_1 b_{1k} + a_2 b_{2k} + \ldots + a_n b_{nk}]$$

Figure 1B:
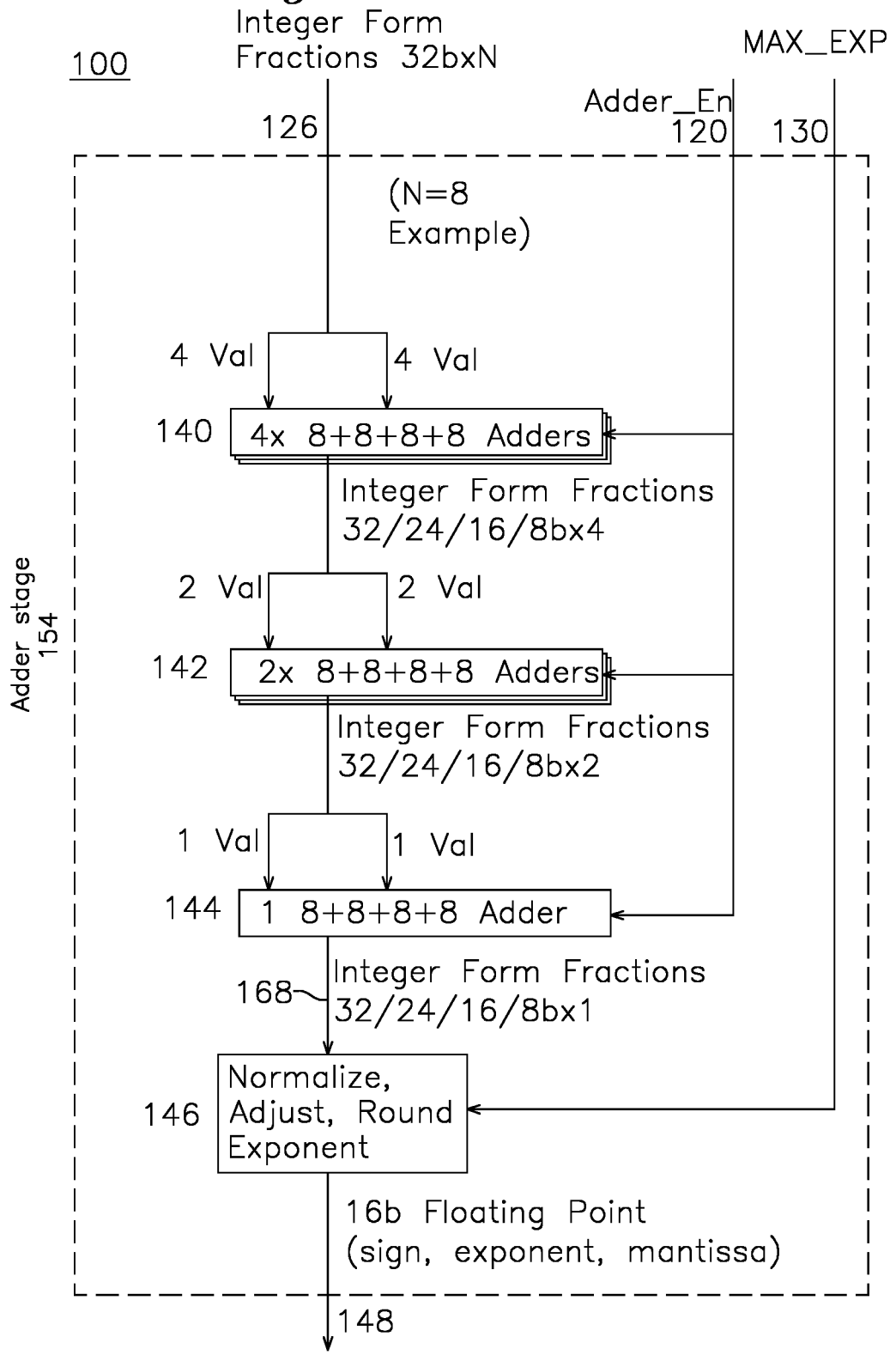

An input row vector 101 such as $[a_1 \ a_2 \ldots a_n]$ and one of the columns of the coefficient matrix 103

$$\begin{bmatrix} b_{1k} \\ \vdots \\ b_{nk} \end{bmatrix}$$

is input to the MAC 100 of FIGS. 1A and 1B, which comprises N simultaneously operating pipeline stages comprising first pipeline stage 150 coupled to a respective second pipeline stage 152 and an adder stage 154. The adder stage 154 may be performed separately since there are N second pipeline stages 152 outputting results into a binary tree of adders, for example 8 adders 124 feeding 4 adders 140 feeding 2 adders 142 and a final single adder 144. For this reason, the adder stage 1154 is shown separate from the second pipeline stage, where each of the N pipeline stages 150 and 152 contains identical processing blocks and Max Exp 112 is a separate processor receiving inputs from all exponent processors 106.

Each MAC processor comprises a MAC processor first pipeline stage 150 and a MAC processor second pipeline stage 152. The MAC processors of 150 and 152 are followed by a common adder stage 154 which receives integer form fractions 156 from all of the MAC processors and forms the single accumulated floating point output value 148. A central find maximum exponent processor 112 receives inputs from all of the exponent processors to generate a maximum exponent sum 164, and a central range estimator 162 receives minimum and maximum estimated ranges from all of the MAC processors to generate an estimated minimum and maximum range for the purpose of determining required adder precision.

MAC processor first stage 150 separates the components (sign, exponent, and mantissa) from the pair of multiplicands (in the present example, one of the example sixteen input 101 terms and a corresponding coefficient 103 term), each term a floating point value comprising a sign bit, 8 exponent bits and 7 mantissa bits). Each of the exemplar N input terms from 101 and corresponding N coefficient terms from 103 are provided to a separate one of the 16 pipeline stages 150/152, each input term and coefficient term separated into sign, exponent, and mantissa component for processing by a respective pipeline stages.

An example floating point value may be represented by:

$$-1^{S}*(1+b_n*2^{-1}+b_{n-1}*2^{-2}+ \ldots +b_0*2^{-n})*2^E$$

where S is the sign bit, and [bn ... b0] is the mantissa (for n bits), and E is the exponent (as an unsigned integer, in the range 0-255 unsigned representing an exponent range −127 to +128 in the present examples). It is important to note that the mantissa leading term 1 which precedes $b_n*2^{-1}$ in the above expression is known as a "hidden bit" in the representation of the floating point number, as it is implied by the floating point format but is not expressly present in the floating point format. Accordingly, the range of a mantissa of the above format is always in the range from 1.0 to less than 2.0. These floating point format examples and N=16 adder tree of FIGS. 1A and 1B are set forth as examples for understanding the invention, although the invention can be practiced with any number of exponent bits and any number of mantissa bits.

Each first pipeline stage 150 has a sign bit processor 105 and sign bit (XOR) register 107, a mantissa processor 104 and fraction register 108, and an exponent processor 106. The Find Max Exponent 112 function is shown in dashed lines as it is a separate module which receives exponent sums from all N stages of exponent processor 106 and provides its MAX_EXP output 164 representing the maximum exponent from among the exponent processors 106 to all exponent processors 106.

Figure 2:
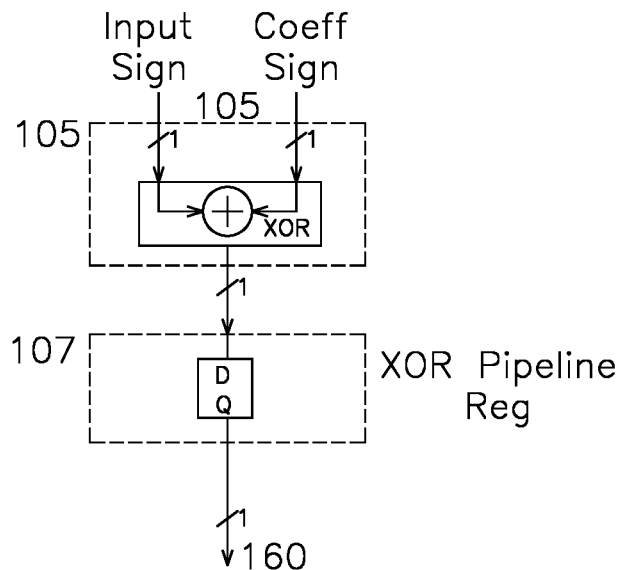
FIG. 2 shows a block diagram of a sign processor.

FIG. 2 shows the sign bit processor 105. Each of the N first pipeline stages 150 receives a corresponding pair of sign bits from a respective Input 101 and associated Coefficient 103 floating point term and performs an XOR 110 (noted as ⊕) of the sign bits to generate a sign bit 160, such that for each pair of sign bits, XOR of sign processor 105 operates according to 0⊕0=0; 0⊕1=1; 1⊕0=1; 1⊕1=0 to generate the sign bit 160 associated with a multiplicand pair.

Figure 3:
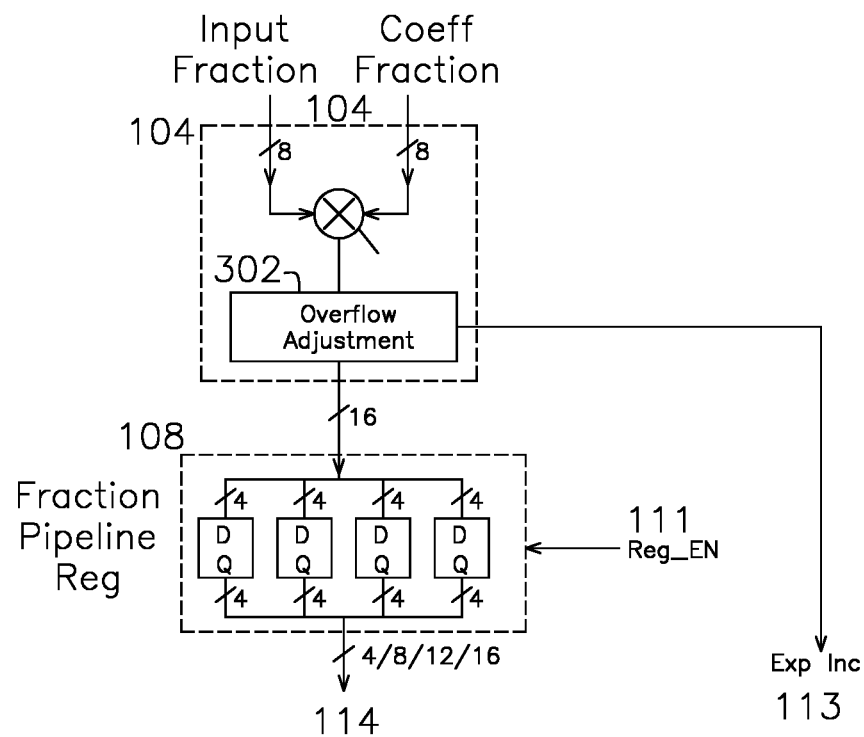
FIG. 3 shows a block diagram for a mantissa processor.

FIG. 3 shows the first pipeline stage mantissa processor 104. The mantissa processor 104 inputs a pair of 7 bit associated mantissa components from floating point input 101 and floating point coefficient 103, restores the "hidden bit" and generates a 16 bit integer mantissa multiply result as an output to fraction pipeline register 108. Mantissas represent a range from 1.0 to 1.99X (with hidden bit as 1.X), where X is specific to the floating point format. For example, the maximum value for a bfloat16 type is 1.9921875, the maximum value for a half precision type (FP16) is 1.9990234375, and the maximum value for a single precision type (FP32) is 1.9999998807907104, formats which are all described in the IEEE standard 754, "Standard for Floating Point Arithmetic". The multiplication of the two floating point values may generate a result as large as 3.99Y (Y indicating additional digits not shown), which requires a scaling by 2 to bring the multiplication result into a range less than 2.0. Such an overflow and scaling from mantissa multiplication 104 is handled by overflow adjustment 302, which scales the result by 2 and generates the EXP_INC bit 113. EXP_INC 113 is delivered through register 110 with exponent processor results, where the PCS processor 122 uses it in combination with (EXP_DIFF), handled by the second pipeline PCS Processor 122. The normalized output of the Mantissa processor in the range 1.0 to 1.X is coupled to the fraction pipeline register 108 for delivery to the second pipeline stage.

Figure 4:
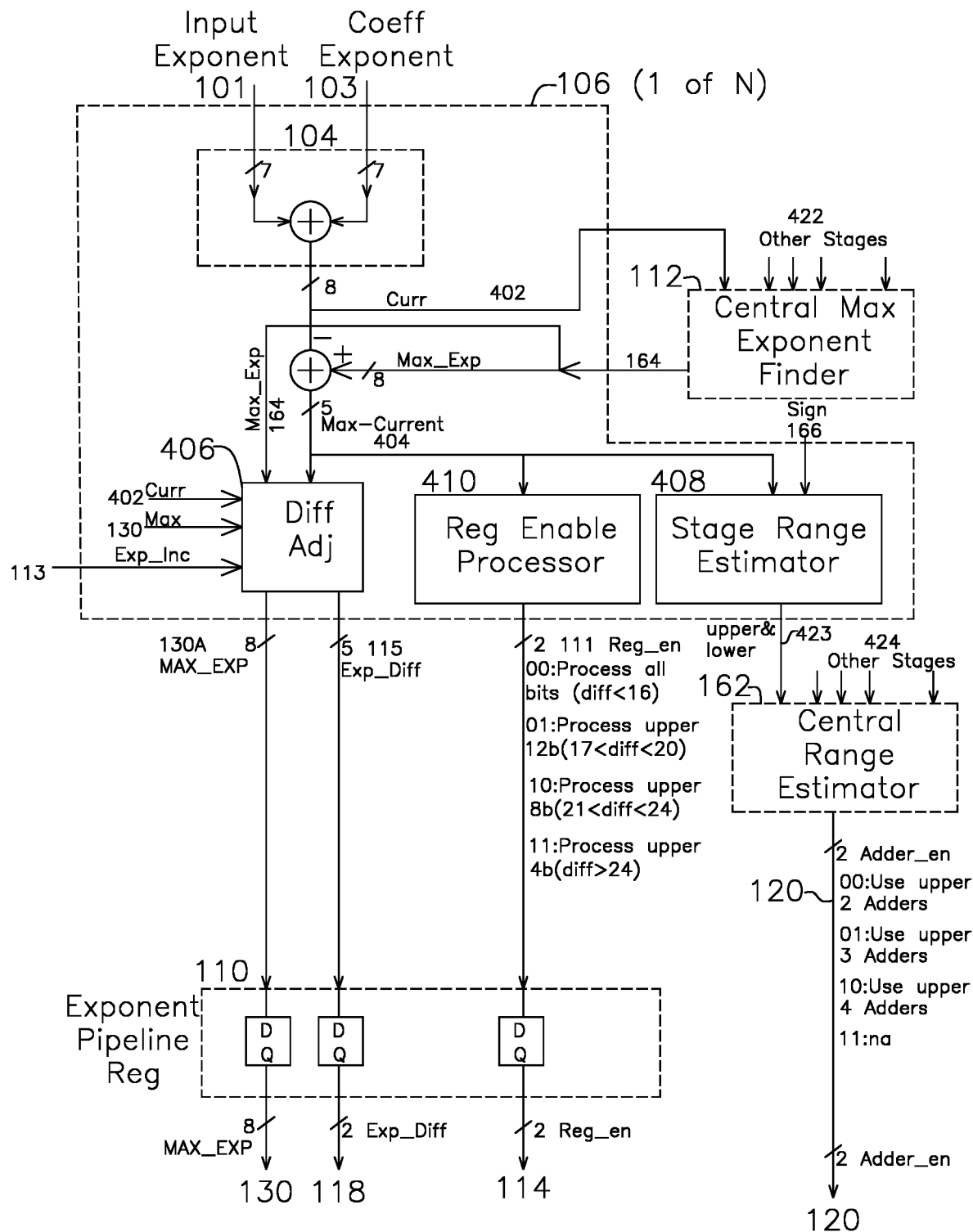
FIG. 4 shows a block diagram for an exponent processor.

FIG. 1A first pipeline stage exponent processor 106 is shown in detail in FIG. 4. Exponent processor 104 computes the sum of the exponents extracted from the input 101 and coefficient 103 terms for each of the N first pipeline stages 107, each simultaneously handling the respective one of the input and coefficient pairs, and operates with commonly shared find max exponent finder 112, which receives exponent sums 402 from all N first pipeline stages and outputs the largest exponent 164 from among all first stage exponent sums, known as an initial MAX_EXP, which may be subject to modification before presentation as MAX_exp 113. The compute exponent difference 406 returns an initial difference 404 between the MAX_EXP 164 and the current exponent sum output 402 for each of the N exponent processors. The exponent processor 106 associated with the stage having the largest MAX_EXP will have an exponent difference (EXP_DIFF) 404 value of 0.

Figure 7A:
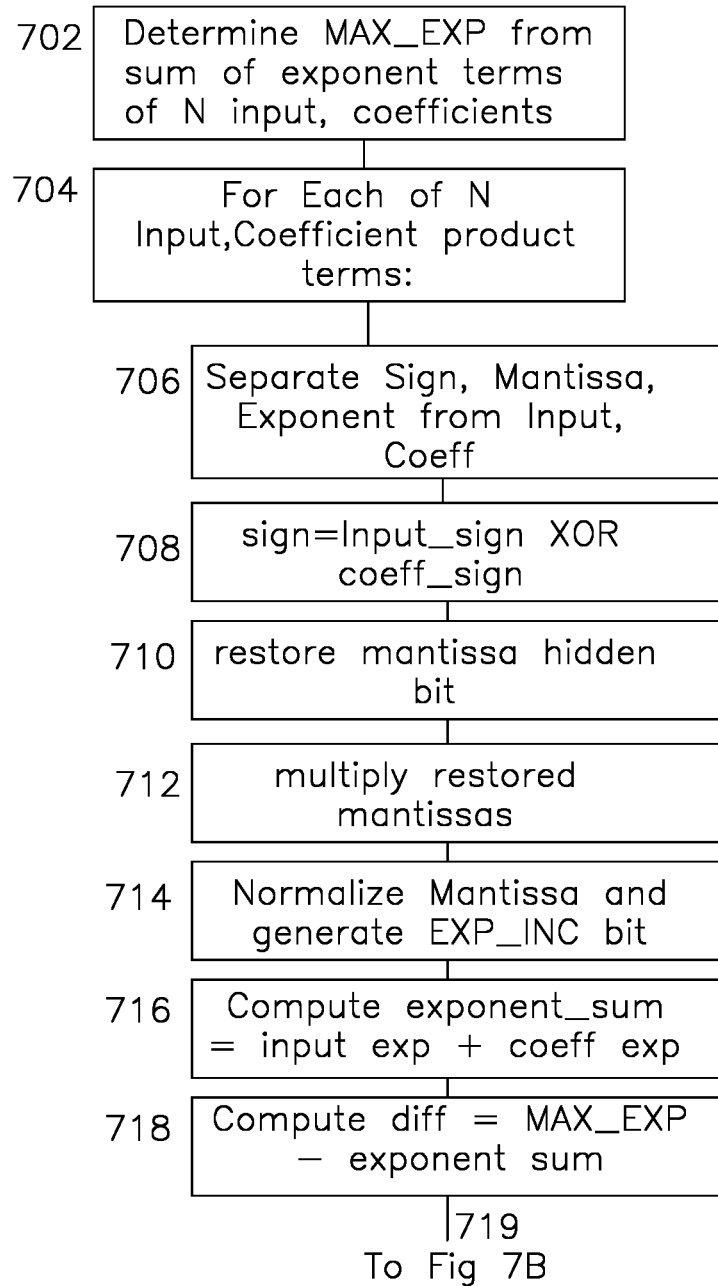
FIGS. 7A, 7B, 7C, and 7D show a flowchart for a process according to the present invention.
Figure 7B:
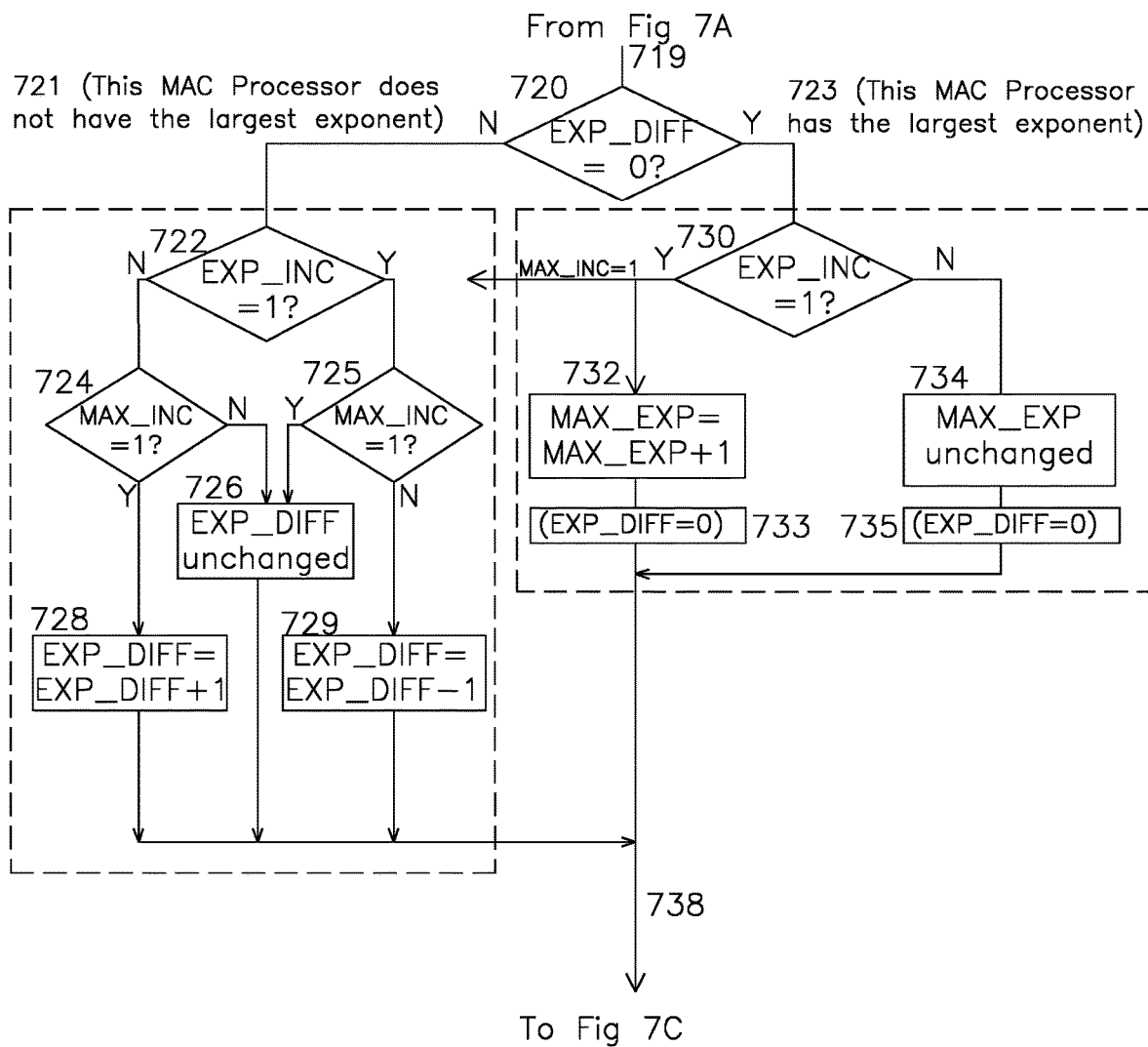

Exponent Difference Adjustment 406 is operative to modify EXP_DIFF (Max_Exp−curr_exp) 404 and MAX_EXP 154 as described below to generate the Exp_Diff output 115 and MAX_EXP 130A according to the method of FIG. 7B, such that:

EXP_DIFF 115 is generated by incrementing Max_exp-current 404 if EXP_INC 113 is not asserted and the current stage is also the largest exponent (path 728 of FIG. 7B);

EXP_DIFF 115 is generated by decrementing max-current 404 if EXP_INC 113 is asserted and the current station is not the largest exponent sum (path 729 of FIG. 7B).

MAX_EXP increments if EXP_INC is asserted and the current station is also the largest exponent (path 732 of FIG. 7B).

Each exponent processor 106 generates an output range_est 117 derived from the exponent difference 404 and sign bit 166, and also generates an output Reg_en 111 derived from the exponent difference 404. These signals are used to reduce power consumption for certain cases that may come up frequently in floating point multiply-accumulate operations. The larger the exponent difference for a particular stage performing one of the N multiplications, the less likely that particular component will influence the accumulated result compared to contributions by multiplication results from pipeline stages with exponent differences closer to 0, and energy can be saved by not toggling register or processor bits for contributions with lower significance. In an example of the invention, Reg_en 111 controls the number of bits processed in the fraction register 108 or optionally mantissa processor 104 based on exponent difference. In one example of the invention shown in FIG. 4, exponent differences greater than 24 use only the most significant 4 bits of the mantissa processor, exponent differences from 21 to 24 use only the most significant 8 bits of the mantissa processor, exponent differences from 17 to 20 use only the most significant 12 bits of the mantissa processor, and exponent differences less than 16 use all bits of the mantissa processor. These examples are given for illustration only, and other numbers of significant bits which increase in number with decreasing exponent difference may be used.

One important feature of exponent summing is that each 8 bit exponent of a floating point format has an exponent range from 0-255 decimal, representing an exponent range from −127 to 128, whereas the exponent sum is being done as unsigned numbers for simplicity in the current example of the invention. Accordingly, when multiplying two floating point numbers A and B with exponents EXP_A and EXP_B, the values represented by the exponent sum as (EXP_A−127)+(EXP_B−127), but when adding these as unsigned integers for simplicity as in the present application, the second −127 must be compensated before forming the exponent in the final stage. This compensation may be done at each MAC Processor exponent processor, or at the final stage before presenting the floating point MAC result. In the present invention, for an 8 bit exponent value, subtracting 127 for this compensation may be done either at each MAC processor exponent processor, or the compensation may be done once at the final output stage 146 by subtracting 127 from MAX_EXP 130 when the leading bit adjustments of normalizing the integer form fraction 168 is done. While not explicitly described in the N exponent processors 106 or the single normalizing stage 146, it is understood that this compensation may be done in either location.

Additionally, the adders 154 do not require full precision if the range of values being added results in a narrow range of possible values, as the lower significant bits of the addition operations similarly do not require as great an adder precision, which can be an additional source of power savings by not enabling those additional bits. In another example of the invention, the adders 124, 140, 142, and 144 are 32 bit adders comprised of a cascaded series of four 8 bit adders which can be enabled independently starting with the most significant 8 bits and adding subsequent 8 bit additional adders. In this embodiment, the exponent processor 106 generates a range estimate 106 based on identifying the smallest signed value and the largest signed value that each mantissa processor and exponent generator could produce by examination of the exponent difference only, combined with the sign bit. Each stage computes its possible signed smallest and largest values, which are added together by overall range estimator 162 to enable an appropriate adder precision, with the example 8 bit adders enabled from most significant adder to least significant adder using the adder_en signal 120. As a simplified example, if N=4 and each stage range estimator 408 generates the (min,max) values (8,16), (−64, −32), (4,8), and (8,16), the central range estimator 162 will estimate a range of (−44, 8). Since this range crosses 0, the summed value could include very small values such as 0.00001, requiring full precision (32 bit in the present example) of the adders. If the second value were (84,168) instead of (−64,−32), the range would be (84,168) (a single power of two different) indicating that the adders require less precision, such as the minimum of two 8 bit adders for 16 bits of precision. The relationship between overall range and number of adders enabled by the central range estimator 162 may be determine in any manner which preserves accuracy. In one example of the invention, an overall estimated range which includes a negative lower value and positive upper value results in adder_en enabling all adders, whereas an overall range which is entirely negative or positive enables fewer than all adders, such as two or three adders. Where the range is entirely positive or entirely negative, and has an upper extent which is separated by a multiple of more than $2^7$ or $2^8$ times the lower extent, enabling one or preferably two 8 bit adders may be used, and if the upper extent is separated by less than a multiple of more than $2^7$ or $2^8$ times the lower extent, enabling two or three adders may be used. In this manner, the adders 124, 140, 142, and 144 operate with variable precision depending on the result of the central range estimator.

The adders 124, 140, 142, and 144 summing the N outputs of the N second pipeline stage 152 PCS processor 122 are shown in FIGS. 1A and 1B for the case N=16, such that for full precision selected by adder_en, adder 124 is operating on 8 pairs of 32 bit values, adder 140 is operating on the resulting 4 pairs of 32 bit values, adder 142 is operating on the resulting 2 pairs of 32 bit values, and adder 144 is operating on the final pair of values to generate an output. In an example of the invention, all adders of an adder tree operate with a precision governed by adder_en.

Figure 5:
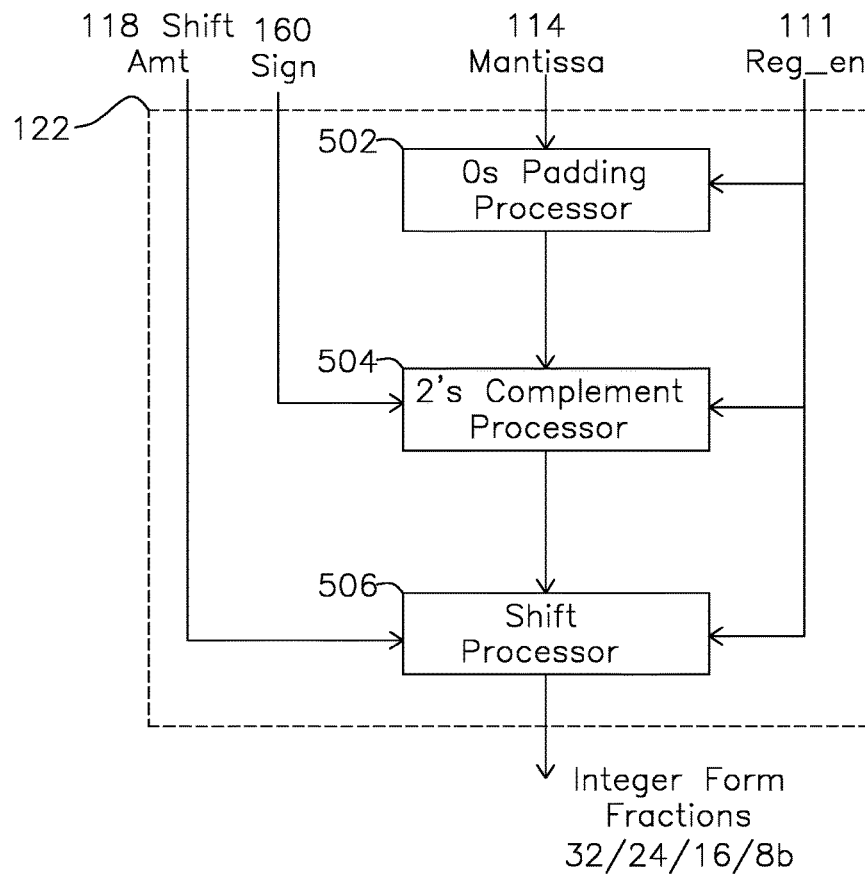
FIG. 5 shows a block diagram for a pad, complement, shift (PCS) processor.
Figure 6:
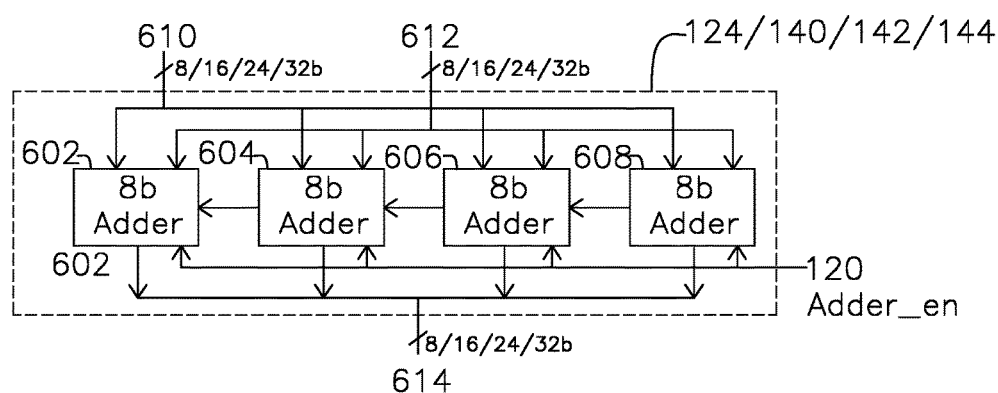
FIG. 6 shows a block diagram for a variable precision adder used in FIGS. 1A and 1B.

The Pad, Complement, Shift (PCS) Processor 122 is shown in the block diagram of FIG. 5. A first stage 502 performs padding of mantissa 114 to add leading 0s and trailing 0s. In one example of the invention, the mantissa 114 is 16 bit and the padding is to 32 bits, typically zero padding the most significant bits according to the number of adder stages to prevent adder overflow in adder stages 124, 140, 142, 144 of adder section 154 of FIG. 1A.

In this manner, each of the N first pipeline stages of FIG. 1A outputs a sign bit 160, normalized mantissa product 114, exponent difference 118, and MAX_EXP value 130, all of which are provided to the second pipeline stage 152.

The second pipeline stage 152 is operative to receive the corresponding first pipeline stage outputs and perform additional operations. The mantissa Pad/Complement Shift (PCS) stage 122 receives the normalized mantissa value 114 from the first pipeline stage 150, and performs a first step of padding, whereby a fixed number of 0s is prepended and a fixed number of 0s is appended. Prepending leading 0s is done to maintain the range and precision of the summed result to prevent subsequent overflows during addition of the results from the example N=16 second pipeline stages during adder stage 154. For the addition of N=16 integers, an optimal padding of four prepended leading 0s is sufficient to prevent an overflow error during the addition of the 16 normalized mantissas. For an example 32 bit integer form fraction, the normalized mantissa integer 114 having 16 bits may be padded with 4 0 bits prepended (to accommodate 16 maximum non-overflow addition operations), and 12 0s may be appended to form a first integer form fraction of 32 bits. In general, the bit size after padding (shown as 32 in the present example, motivated by the use of four 8 bit adders which are individually enabled by Adder_en 120 from FIG. 4 stage 408 according to central range estimator 162) is a function of the multiplier output fraction width (16 bits in this example), the number of additions (16 in the present example, so the number of prepended padding bits is log base 2 of 16=4), and number of lower bits to preserve to maintain a desired accuracy during the mantissa additions. Alternatively, for a MAC summing 32 products, we have 5 ($log_2$ 32) prepended 0s+11 (appended 0s)+16 (bit precision of addition)=32 bits through the adders 124, 140, 142, 144. In other examples of the invention, the integer form fractions 156 output by the Mantissa PCS stage 122 may range from 16 to 32 bits or an even wider range, depending on these parameters. Following the first step 502 of padding described above and shown in FIG. 5, a second stage of PCS 122 is to substitute a two's complement of the first integer form fraction if the sign bit 160 is negative in step 504, otherwise the first integer form fraction output by stage 502 remains unmodified. A third stage of PCS 122 is to perform a right shift by the number of positions indicated by adjusted exponent difference EXP_Diff 118 from exponent processor 106 of FIG. 1A and FIG. 4.

The third step mantissa shift stage 506 of FIG. 1 122 is governed by Exp_diff 118 from the exponent processor 106 and pipeline register 110 of FIG. 4 with the modifications which generate Exp_Diff 118 and MAX_EXP 130 as previously described for FIGS. 4 and 7B. EXP_DIFF 118 determines how many bit positions the associated mantissa will right shift in shift processor 506 according to the Exp_Diff 118.

The N output values from the Mantissa PCS 122 stage are summed in adder stage 154 as a binary tree of adders 124, 140, 142, and 144, resulting in a single integer form fraction value sent to output stage 146. If the integer form fraction 168 input to 146 is negative, then a negative sign bit component is generated, and a 2s complement of the integer form fraction 168 input to 146 is generated, along with a normalization step to round the integer form fraction 168 to the nearest 7 bit mantissa value and truncated to the mantissa component output format, in the present example, 7 bits (without hidden "1." bit as previously described), and the exponent component is the MAX_EXP 130 output by exponent difference adjustment stage 406 with decimal 127 subtracted and also subtracting the number of leading 0s (ignoring the number of padded 0s) and left shifting the mantissa in one example of the invention. The number of pre-pended 0s of the PCS stage are removed during normalization, but not used in computing the adjusted exponent of the final MAC floating point result. If the integer form fraction input to output stage 146 is positive, the sign bit component is 0, the mantissa component is rounded and truncated to the number of bits required, and the exponent component is computed as before. The floating point output value is then the sign bit component, the exponent component, and the mantissa component according to the standard format previously described for floating point numbers.

FIGS. 7A, 7B, 7C, and 7D show the operation of the unit element MAC as a process 700 for computing floating point accumulated value for a sum of products of floating point input I floating point coefficient C, such that $P=I_1C_1+I_n C_n+ \ldots +I_N C_N$. Step 702 computes a determination of MAX_EXP from the sum of exponent terms for each product term across the floating point exponent component of all N terms. Step 704 initiates a series of steps 706, 708, 710, 712, 714, 716, 718, and FIG. 7B steps of the adjustment stage compute any changes in MAX_EXP and EXP_DIFF, with FIG. 7C 740, 742, 744, 746, and 748 performed for each of the N product terms.

Step 706 is the separation of sign, mantissa, and exponent, as was previously described in FIG. 1A. Step 708 performs the sign bit process of sign processor 105, performing an exclusive OR of the sign bits and returning a sign bit for later use in step 742. The mantissa processor 104 operations include step 710 which restores the hidden mantissa bits prior to multiplication 712, and normalization 714, corresponding to mantissa processor 104 of FIG. 1A as previously described. The mantissa is normalized 714, which also generates the MAX_EXP value previously described. The exponent sum 716 is computed for each result by the exponent processors 106, or preferably is provided for each of the N product terms as part of step 702, which performed this step as part of determining MAX_EXP. The exponent difference (EXP_DIFF) from MAX_EXP is computed in step 718, which leads to step 719 of FIG. 7B.

FIG. 7B shows the exponent difference adjustment stage 406 of FIG. 4 for each of the N second pipeline stages of FIG. 1A. Step 720 EXP_DIFF=0 indicates adjustment steps 723 for a stage with the largest exponent sum, specifically incrementing MAX_EXP 732 if EXP_INC is set 730, which also causes a flag MAX_INC to be distributed to other stages. Where multiple stages satisfy the test EXP_DIFF=0 of 723 (multiple stages have the same maximum sum of input exponent and coefficient exponent), and multiple of these same stages have EXP_INC=1, MAX_EXP only increments once 732 and the value EXP_DIFF=0 remains unchanged (733, 735). Stages which do not have the MAX_EXP (indicated by EXP_DIFF>0 720), are processed as shown in 721, where the combination of EXP_INC=1 and MAX_INC not set 725 result in decrementing EXP_DIFF 729, and stages which have MAX_INC set with EXP_INC not set increment EXP_DIFF 728. Other combinations of EXP_INC and MAX_INC do not adjust EXP_DIFF 726.

Figure 7C:
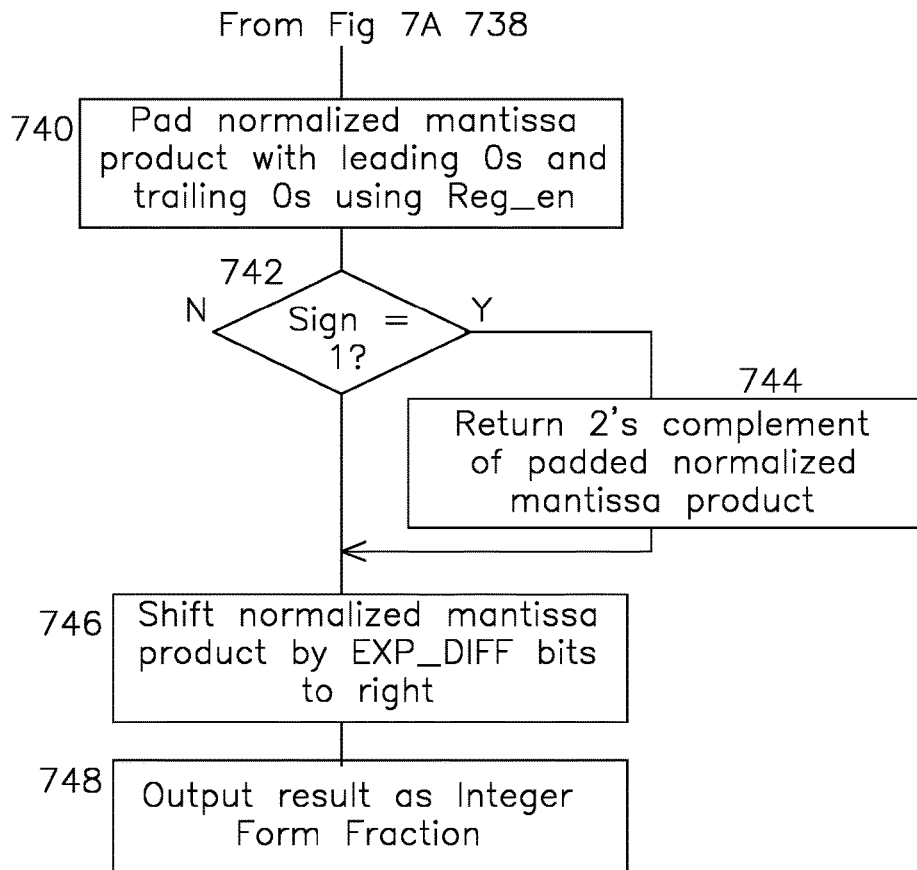

FIG. 7C shows a continuation of processing of FIG. 7B, showing the mantissa PCS steps of PCS processor 122 of FIG. 1A, with the steps of padding 740, conditional ones complement 744 if the sign bit is negative 742 from step 708, shifting by EXP_DIFF in step 746, and the output of a single integer form fraction in step 748. Each of the N product terms generates the integer form fraction output 748.

Figure 7D:
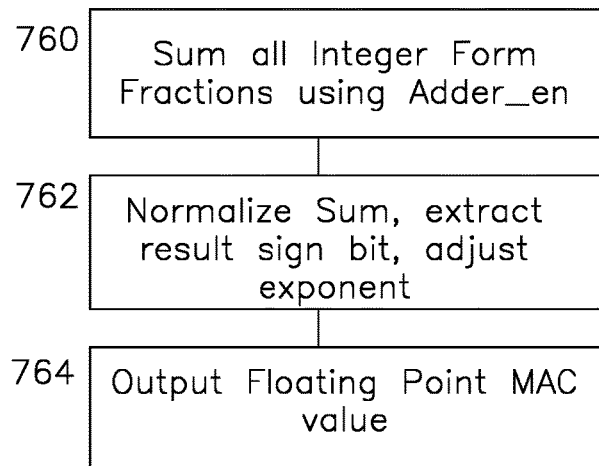

FIG. 7D shows the summing 746 of all product terms output in step 748, after which the sum is normalized to 8 bits, sign adjustments made (taking the two's complement and setting the sign bit to 1 if a negative sum results), and adjusting the exponent, as was described in step 146 of FIG. 1B.

FIGS. 1A and 1B describe an embodiment where an incoming N (shown for the case N=16) pairs of floating point values comprising a floating point input 101 and floating point coefficient 103 are processed simultaneously by N first pipeline stages, N second pipeline stages, and an adder stage 119 simultaneously sums N/2 integer form fractions in a first stage, N/4 integer form fractions in a second stage, and 2 integer form fractions in a final stage, performing the additions in a binary tree, shown for N=16. Other variations of the invention are possible. For example, a single instance of first pipeline stage 107 and second pipeline stage 109 may be used in sequence with each coefficient pair, the output values being sent to an accumulating adder stage 119, which simply adds the new result to the previous one N for each of the N cycles until complete, with the normalization 146 occurring as before. However the order of operations is performed, MAX_EXP for the sum of exponents of the N pairs of floating point values must be determined prior to the sequential processing. In this case, a separate MAX_EXP processor which determines MAX_EXP may be used to scan the N pairs of exponents.

Figure 8A:
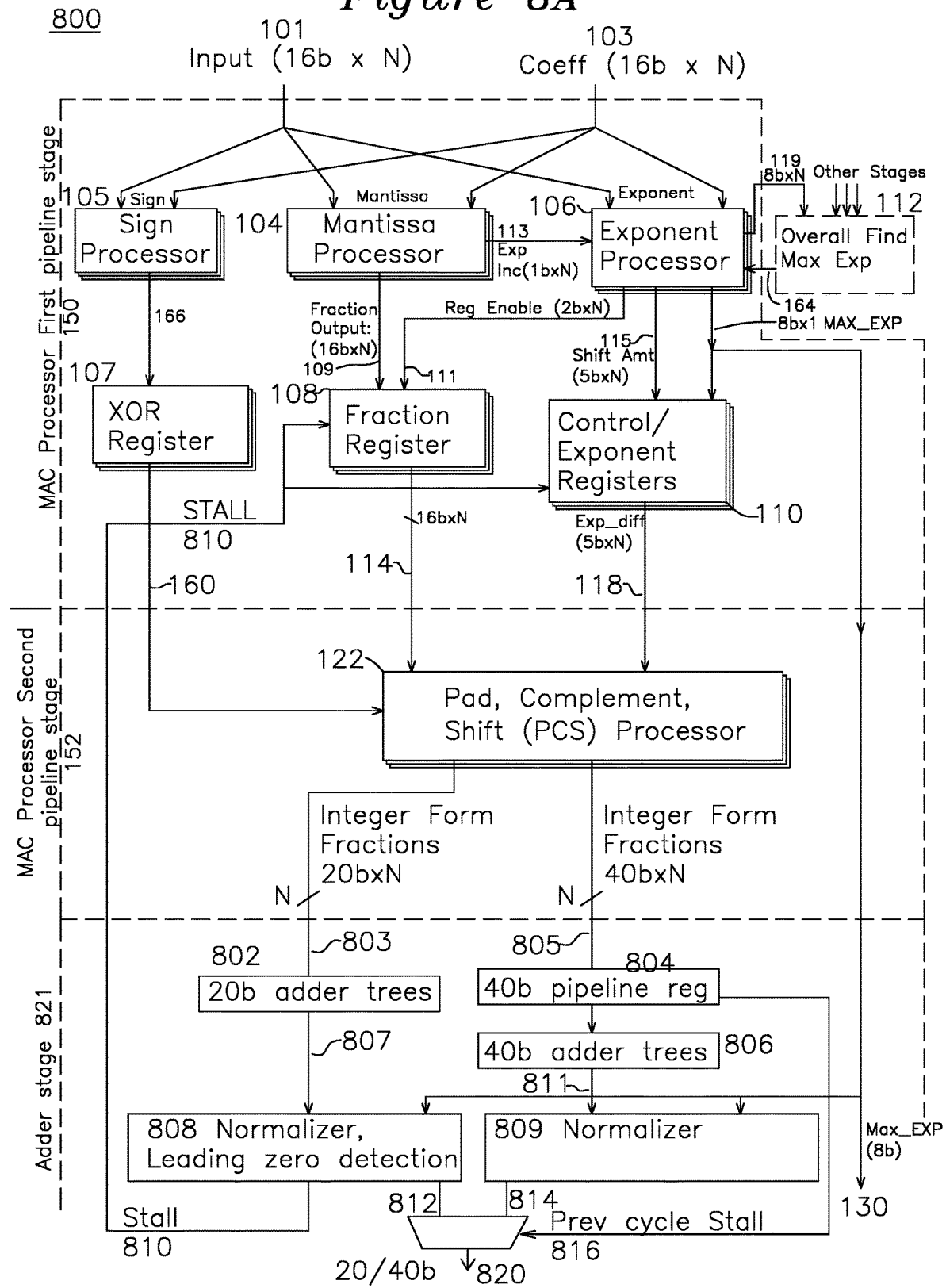

In a second example of the invention shown in FIGS. 8A, 8B, and 8C, a problem is addressed whereby the summed integer form fractions from PCS 122 may sum to a value close to zero, resulting in a mantissa that is limited by the adder tree 802 resolution and PCS processor 122 output resolution. However, power consumption is increased by having all of the adder tree 802 operations and PCS processor 122 operations performed continuously on full resolution mantissas to avoid the risk of having them sum to a value with a large number of leading 0 bits. It is desired to detect the "near zero" sum condition and thereafter perform the PCS function on a greater number of bits. In this embodiment of the invention, the previous processing is performed the same as was described in FIG. 1A, however the PCS processor 122 provides a first bitwidth output 803 and a second bitwidth output 805 which has greater precision (bits) than the first bitwidth. The first bitwidth output 803 and second bitwidth output 805 may be provided concurrently (since the only the additional bits to form the second bitwidth output need to be added), or in a separate calculation so that the PCS processor computes a result with the second bitwidth only after it is detected that the summed result 807 has an excess number of leading zeros. By way of example, FIG. 8A shows the PCS processor 122 generating a first bitwidth output 803 of 20 bits and a second bitwidth output 805 of 40 bits. The 20 bit output 803 is passed directly to the example 20 bit adder tree 802 which adds the N values together to form a single value 807, which is passed to normalizer and leading zero detector 808. If a threshold ratio of leading 0s to first bitwidth in sum 807 is crossed, such as 50% or 75%, then normalizer and leading zero detector 808 asserts a stall condition 810, during which time the values stored in the second bitwidth pipeline register 804, which contains N second bitwidth values (with greater precision than the N first bitwidth values that resulted in the summed value threshold detection and stall condition) are sent to the second bitwidth adder tree 806 and the single resulting sum is sent to normalizer 809, and the normalized floating point value 820 is generated as an output.

FIG. 8B shows the normalizer function of 808 and 809 of FIG. 8A (and 146 of FIG. 1A). As was previously described, the normalizer function 808 and 809 (and 146) generates a floating point final value from the summed value from the adder tree and MAX_EXP value. If the final sum value 809 or 809 (or 168), is negative then a 2's complement is performed which sets the final sign bit accordingly, next the leading zeros are removed with the number of leading 0s subtracted from MAX_EXP to form a final exponent, the hidden bit is removed, and the fraction is rounded to the nearest 7 bit mantissa to form a final mantissa. The final result 812 or 814 (or 148) is formed by concatenating the final sign bit, the final mantissa, and final exponent. As was mentioned previously, the addition of exponent values (with range −127 to +128) as unsigned integers requires subtracting 127 from the adjusted sum to avoid a double bias. Subtracting 127 from the exponent sum may be done at the final normalization stage, or at each exponent processor before the final normalization. Furthermore, the number of leading 0s of the PCS processor padding are not considered in the leading 0 exponent adjustment, and fewer leading 0s cause the final result floating point exponent to be increased. For example, for an 8 bit exponent, if P=number of pad bits of the PCS processor padding step, M=number of leading 0s of the final adder tree output, then the final stage floating point exponent would be exponent difference−127−(M−P).

FIG. 8C shows an example dual 40b/80b adder tree, where each adder 822, 824, 826, 828 (for N=16) is cascaded as shown, with each adder controlled by a mode bit 816 that selects operation between the first bitwidth and the second bitwidth, and which may be used for adder tree The present examples are provided for illustrative purposes only, and are not intended to limit the invention to only the embodiments shown. For example, the apparatus may be practiced as N pipeline stages operating concurrently, each pipeline stage forming an integer form fraction for use by a summing stage, with a first and second pipeline stage, so that each clock cycle generates a new MAC result. Alternatively, it is possible to scan the exponent sums to determine the MAC_EXP value, and thereafter to compute and sum each integer form fraction output from each Mantissa PCS stage separately, and accumulate each mantissa PCS output sequentially. The invention may be practiced as an apparatus or as a process without limitation to the examples provided merely for understanding the invention.

I claim:

1. A floating point multiplier-accumulator (MAC) multiplying and accumulating N operands, each operand comprising an input value and a coefficient value, the floating point MAC comprising:
   a plurality N of MAC processors, each MAC processor receiving a unique one of the N operands comprising an associated input value and an associated coefficient value, each MAC processor comprising:
      a sign processor configured to perform an exclusive OR operation on a sign bit of the associated input value and a sign bit of the associated coefficient value, the sign processor outputting a corresponding sign bit;
      a mantissa processor configured to perform an integer multiplication of a mantissa of the associated input value and a mantissa of the associated coefficient value and output a fraction, the mantissa processor asserting an exponent increment and dividing the fraction by two if an overflow condition occurs;

an exponent processor determining an exponent sum of an exponent of the associated input value and an exponent of the associated coefficient value, the exponent processor receiving a maximum exponent sum value from a centralized find maximum exponent processor, the exponent processor incrementing the maximum exponent sum value if the exponent increment is asserted and an exponent difference is zero, the exponent processor also outputting the exponent difference between the maximum exponent sum value and the exponent sum;

a Pad, Complement, Shift (PCS) Processor receiving the fraction from the mantissa processor, the corresponding sign bit from the sign processor, and the exponent difference, the PCS processor configured to take a 2s complement if the corresponding sign bit is negative, pad the fraction by pre-pending and appending 0s to the fraction to generate a first value, and right shifting by the exponent difference and outputting a result as a PCS first output value having a first bitwidth, and also outputting the result as a PCS second output value having a second bitwidth greater than the first bitwidth;

the centralized find maximum exponent processor receiving an exponent sum from each exponent processor of the MAC processors, identifying a maximum exponent sum and outputting the maximum exponent sum;

a pipeline register storing the N PCS second output values;

a first adder tree having the first bitwidth and summing N PCS output first values and configured to output a first sum;

a second adder tree having the second bitwidth and summing N PCS output second values if the first adder output has more than a threshold percentage of leading 0s and configured to output a second sum;

a final stage configured to output a floating point value by normalizing the second sum to generate a sign bit, a mantissa, and a number M of left shift bit positions to remove the leading 0s, the final stage thereafter concatenating the sign bit, the mantissa, and an exponent derived from the maximum exponent.

2. The floating point MAC of claim 1 where the exponent derived from the maximum exponent is the maximum exponent minus an exponent correction caused by adding exponent sums as unsigned values.

3. The floating point MAC of claim 2 where the exponent derived from the maximum exponent is an 8 bit value and the exponent correction is 127 and performed in either each MAC processor exponent processor, or in the final stage.

4. The floating point MAC of claim 1 where normalizing the first sum or normalizing the second sum comprises: if the most significant bit (MSB) of the first sum or the second sum is set, replacing the respective first sum or second sum with a 2s complement of the respective first sum or second sum, thereafter replacing the respective first sum or second sum with a left shifted respective first sum or second sum shifted by the number M of left shift bit positions until no leading 0 bits remain and setting the sign bit.

5. The floating point MAC of claim 2 where the exponent has a precision of 8 bits and the exponent correction comprises subtracting 127.

6. The floating point MAC of claim 1 where a stall condition is asserted when the first sum has a number of leading 0 bits of a first final stage mantissa which exceeds a threshold, the stall condition causing the second adder tree to be enabled after the stall condition.

7. The floating point MAC of claim 1 where the second adder tree is enabled if the first sum has more than 50% or 75% leading 0s of a bitwidth of the first sum.

8. The floating point MAC of claim 1 where the PCS processor is operative with a bitwidth determined from a MAC processor exponent difference.

9. The floating point MAC of claim 1 where the exponent difference of each MAC processor is incremented if the mantissa processor does not overflow and the exponent difference is not 0.

10. The floating point MAC of claim 1 where the exponent difference of each MAC processor is decremented if the mantissa processor has an overflow and the exponent difference is not 0.

11. The floating point MAC of claim 1 where the maximum exponent is incremented if the exponent difference is 0 and the mantissa processor has an overflow.

12. The floating point MAC of claim 1 where the mantissa's precision is 4 bits when the exponent difference is greater than 24.

13. The floating point MAC of claim 1 where the mantissa's precision is 8 bits when the exponent difference is greater than 21.

14. The floating point MAC of claim 1 where the mantissa's precision is 12 bits when the exponent difference is larger than 12.

15. A floating point multiplier-accumulator (MAC) multiplying and accumulating N operands, each operand comprising an associated input value and an associated coefficient value, the floating point MAC comprising:

a plurality N of MAC processors, each MAC processor receiving the associated input value and the associated coefficient value, each MAC processor comprising:

a sign processor configured to perform an exclusive OR operation on a sign bit of the associated input value and a sign bit of the associated coefficient value resulting in a sign bit output;

a mantissa processor configured to perform an integer multiplication of a hidden bit restored mantissa of the associated input value and a hidden bit restored mantissa of the associated coefficient value and outputting a resulting fraction, and upon an overflow condition of the resulting fraction, the mantissa processor dividing the resulting fraction by two and asserting an exponent increment;

an exponent processor generating an exponent sum of an exponent of the associated input value and an exponent of the associated coefficient value, the exponent processor receiving a maximum exponent from a centralized find maximum exponent processor, the exponent processor modifying the maximum exponent and also outputting an exponent difference computed by subtracting the exponent sum from the maximum exponent, the exponent processor also using the exponent difference and the sign bit output to estimate a precision bitwidth;

a Pad, Complement, Shift (PCS) Processor receiving the resulting fraction from the mantissa processor and also the sign bit output from the sign processor, the PCS processor configured to perform operations with the precision bitwidth and pad the resulting fraction by pre-pending and appending 0s to the resulting fraction to generate a first value, thereafter generating a second value by performing a two's complement of the first value if the sign bit output is negative and otherwise taking no action on the first value, the PCS processor configured to performing a shift operation on the second value by right shifting the second value by a number of bits derived from the exponent difference to generate a PCS output;

the centralized find maximum exponent processor receiving an exponent sum from each MAC processor exponent processor, the centralized find maximum exponent processor outputting a maximum exponent value corresponding to a maximum exponent processor sum from each N MAC processor exponent processor's exponent sum;

a first binary tree of adders having a first bitwidth and summing N PCS output values to a single value;

a second binary tree of adders having a second bitwidth greater than the first bitwidth, the second binary tree of adders summing the N PCS output values to the single value when a number of leading 0s of the single value of the first binary tree exceeds a threshold;

a final stage normalizing the single value, thereby determining a sign bit, a mantissa, and a number of shift bit positions to remove leading zeros from the single value, the final stage outputting a floating point result by concatenating the sign bit, the mantissa, and an exponent derived from the maximum exponent and the number of shift bit positions.

16. The floating point MAC of claim 15 where at least one of the associated input values is a floating point value, at least one of the associated coefficient values is a floating point coefficient value, or the floating point result has an 8 bit exponent, and the exponent is derived from the maximum exponent, wherein the exponent is determined from the maximum exponent after subtracting 127 and after subtracting a sum of the number of leading zeros of the single value minus a number of bits prepended by the corresponding PCS processor.

17. The floating point MAC of claim 15 where each MAC processor exponent processor computes a mantissa precision based on the exponent difference, and at least one of a mantissa processor or a PCS processor is operative using the mantissa precision.

18. The floating point MAC of claim 17 where the mantissa's precision is 4 bits when the exponent difference is greater than 24.

19. The floating point MAC of claim 17 where the mantissa's precision is 8 bits when the exponent difference is greater than 21.

20. The floating point MAC of claim 17 where the mantissa's precision is 12 bits when the exponent difference is larger than 12.

* * * * *